: US006156487A

United States Patent [19]
Jennison et al.

[11] Patent Number: 6,156,487
[45] Date of Patent: Dec. 5, 2000

[54] TOP SURFACE IMAGING TECHNIQUE FOR TOP POLE TIP WIDTH CONTROL IN MAGNETORESISTIVE READ/WRITE HEAD PROCESSING

[75] Inventors: Michael J. Jennison, Broomfield, Colo.; Wei Pan, Goleta, Calif.

[73] Assignee: Matsushita-Kotobuki Electronics Industries, Ltd., Saijo, Japan

[21] Appl. No.: 09/177,901

[22] Filed: Oct. 23, 1998

[51] Int. Cl.[7] .................................................. G03C 5/00
[52] U.S. Cl. .......................................... 430/316; 430/311
[58] Field of Search .................................. 430/311, 312, 430/313, 314, 316; 360/113; 427/130

[56] References Cited

U.S. PATENT DOCUMENTS

| | | | |
|---|---|---|---|
| 5,485,334 | 1/1996 | Nix et al. | 360/113 |
| 5,532,892 | 7/1996 | Nix et al. | 360/113 |
| 5,573,809 | 11/1996 | Nix et al. | 427/123 |
| 5,608,593 | 3/1997 | Kim et al. | 360/113 |
| 5,634,260 | 6/1997 | Nix et al. | 29/603.14 |
| 5,637,235 | 6/1997 | Kim et al. | 216/22 |
| 5,639,509 | 6/1997 | Schemmel | 427/130 |
| 5,654,854 | 8/1997 | Mallary | 360/113 |
| 5,658,469 | 8/1997 | Jennison | 216/22 |
| 5,665,251 | 9/1997 | Robertson et al. | 430/323 |
| 5,668,688 | 9/1997 | Dykes et al. | 360/113 |
| 5,925,578 | 7/1999 | Bae | 438/736 |

*Primary Examiner*—S. Rosasco
*Attorney, Agent, or Firm*—William J. Kubida, Esq.; Stuart T. Langley, Esq.; Hogan & Hartson, LLP

[57] ABSTRACT

A top surface imaging technique for top pole tip width control in a magnetoresistive ("MR") or giant magnetoresistive ("GMR") read/write head is disclosed in which a multi-layer structure is employed to define the thick photoresist during processing resulting in much improved dimensional control. To this end, a relatively thin upper photoresist layer is patterned with much improved resolution, an intermediate metal or ceramic layer is then defined utilizing the upper photoresist layer as a reactive ion etching ("RIE") mask, with the intermediate layer then being used as an etching mask to define the bottom-most thick photoresist layer in a second RIE process. As a consequence, a much improved sub-micron pole tip width along with a high aspect ratio and vertical profile is provided together with much improved critical dimension control.

16 Claims, 4 Drawing Sheets

TOP SURFACE IMAGING TECHNIQUE FOR TOP POLE TIP WIDTH CONTROL IN MAGNETORESISTIVE READ/WRITE HEAD PROCESSING

CROSS REFERENCE TO RELATED PATENTS

The subject matter of the present invention is related to that disclosed in U.S. Pat. No. 5,485,334 for "Magnetoresistive Device and Method Having Improved Barkhausen Noise Suppression"; U.S. Pat. No. 5,532,892 for "Soft Adjacent Layer Biased Magnetoresistive Device Incorporating a Natural Flux Closure Design Utilizing Coplanar Permanent Magnet Thin Film Stabilization"; U.S. Pat. No. 5,573,809 for "Process for Forming a Magnetoresistive Device"; U.S. Pat. No. 5,608,593 for "Shaped Spin Valve Type Magnetoresistive Transducer and Method for Fabricating the Same Incorporating Domain Stabilization Technique"; U.S. Pat. No. 5,634,260 for "Method of Making a Magnetoresistive Device Having Improved Barkhausen Noise Suppression"; U.S. Pat. No. 5,637,235 for "Shaped Spin Valve Type Magnetoresistive Transducer and Method for Fabricating the Same Incorporating Domain Stabilization Technique"; U.S. Pat. No. 5,639,509 for "Process for Forming a Flux Enhanced Magnetic Data Transducer"; U.S. Pat. No. 5,654,854 for "Longitudinally Biased Magnetoresistive Sensor Having a Concave Shaped Active Region to Reduce Barkhausen Noise by Achieving a Substantially Single Magnetic Domain State"; U.S. Pat. No. 5,658,469 for "Method for Forming Re-Entrant Photoresist Lift-Off Profile for Thin Film Device Processing and a Thin-Film Device Made Thereby"; and U.S. Pat. No. 5,668,688 for "Current Perpendicular-to-the-Plane Spin Valve Type Magnetoresistive Transducer", the disclosures of which are herein specifically incorporated by this reference.

BACKGROUND OF THE INVENTION

The present invention relates, in general, to the field of magnetoresistive ("MR") and giant magnetoresistive ("GMR") read/write heads. More! particularly, the present invention relates to a technique for top surface imaging for top pole tip width control in MR write head processing.

Top pole tip definition for the write transducer portion of a read/write head and its critical dimension ("CD") control currently present major challenges in thin film MR/GMR head processing. As the demand for ever more storage capacity in disk drives intensifies resulting in the need for areal recording densities of on the order of 20,000 to 35,000 tracks per inch ("TPI") and greater, future generations of these heads must then exhibit a track width which is increasingly reduced while nevertheless maintaining a high stack height for performance reasons.

As a consequence, these constraints imply that the critical dimensions of the top pole tip of the write head must be in the sub-micron range of on the order of 0.30 to 0.8 microns ("$\mu$m"). However, utilizing current thin film photolithography techniques and steppers, it is extremely difficult to pattern tip widths of such narrow dimensions while also providing high aspect ratios and vertical profiles together with tight critical dimension control due to the limitation of resolution inherent in a conventional thick photoresist pattern of on the order of 6.0 $\mu$m–10.0 $\mu$m. While conventional processing can be used in conjunction with a slider level pole trim operation as one way to achieve a sub-micron write track width, such an operation is extremely costly in a manufacturing environment with the further possibility that it can easily result in damage to the associated MR and/or GMR read sensor.

SUMMARY OF THE INVENTION

In accordance with the technique of the present invention a top surface imaging technique for top pole tip width control is disclosed in which a multi-layer structure is employed to define the thick photoresist with much improved dimensional control. To this end, a relatively thin upper photoresist layer is patterned with much improved resolution, an intermediate layer of ceramic or metal is then defined utilizing the upper photoresist layer as a reactive ion etching ("RIE") mask, with the intermediate layer then being used as an etching mask to define the bottom-most thick photoresist layer by a second RIE process. As a consequence, a much improved sub-micron pole tip width along with a high aspect ratio and vertical profile is provided together with much improved critical dimension control.

In operation, the technique of the present invention allows current stepper and process technology to be expanded beyond conventional resolution limits due to the fact that it effectively transfers the difficulties inherent in thick photoresist definition to another relatively thin photoresist pattern definition, utilizing a RIE process to define the resultant critical dimensions. Overall, the technique of the present invention provides a number of advantages including the provision of high aspect ratio and vertical profiles in a sub-micron pole tip, increased optical resolution utilizing conventional stepper equipment and improved critical dimension control. Stated another way, the technique of the present invention, in utilizing a relatively thin patterned photoresist layer for the critical pattern definition followed by a reactive ion etching operation to accurately transfer the pattern from an upper surface through an intermediate and underlying thick photoresist layer, allows one to effectively pattern the thick photoresist layer by only exposing the upper thin photoresist layer. The use of the patterned thin photoresist layer in conjunction with the intermediate layer and underlying thick photoresist layer ultimately provides much improved trackwidth control while concomitantly extending the useful lifetime of current stepper technology. The technique of the present invention also provides greater head design flexibility since less stringent process requirements are needed to achieve a given desired stack height.

Particularly disclosed herein is a process for forming a pole tip in a data transducer write head, and an upper pole of a read/write head made thereby, which comprises: providing a substrate; applying a first photoresist layer overlying the substrate; applying an intermediate layer overlying the first photoresist layer; applying a second photoresist layer overlying the intermediate layer, the second photoresist layer being relatively thinner than the first photoresist layer; patterning the second photoresist layer to produce an opening therein; etching the intermediate layer utilizing the opening as a mask; further etching the first photoresist layer through the opening utilizing the intermediate layer as another mask; forming the pole tip within the opening etched in the first photoresist layer; and removing the first and second photoresist layers and the intermediate layer to expose the pole tip.

Further disclosed herein is a read/write head for a computer mass storage device wherein an upper pole thereof is made by the process of: providing a multi-layer structure comprising a first relatively thick photoresist layer overlying a gap layer of the read/write head, an intermediate Layer overlying the first relatively thick photoresist layer and a second relatively thin photoresist layer overlying the intermediate layer; patterning the second relatively thin photoresist layer to provide an opening therein to the intermediate layer; etching the intermediate layer and the first relatively thick photoresist layer within the opening to the gap layer; forming the upper pole within the opening etched in the first relatively thick photoresist layer; and removing the first relatively thick and second relatively thin photoresist layers and the intermediate layer.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1A:
FIG. 1A is a simplified side elevational cut-away view of a portion of an MR or GMR process substrate upon which a seed layer, for example NiFe, is deposited to a thickness of substantially between 1000 Å2000 Å.

With reference now to FIG. 1A, a simplified side elevational, cut-away view of a portion of an NR or GMR write head substrate 10 is shown. The substrate 10, shown not to scale, may comprise, for example, an alumina ($Al_2O_3$) or other suitable write head gap layer material of on the order of 4000 Å in thickness overlying a bottom pole of the write head (not shown) and/or a shared shield of an underlying MR or GMR read head of varying types as described in the aforementioned United States Patents. A seed layer 12, for example a nickel iron (NiFe) or similar magnetic pole material, is deposited to a thickness of substantially between 1000 Å–2000 Å. In alternative embodiments, the seed layer 12 may comprise, for example, a relatively higher magnetic moment material such as iron nitride (FeN) or cobalt nickel iron (CoNiFe).

Figure 1B:
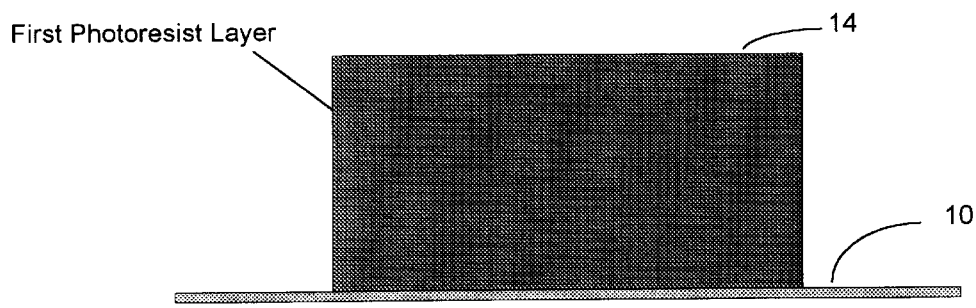
FIG. 1B is a follow-on cross-sectional view of the structure of FIG. 1A illustrating the application of a relatively thick coating (on the order of substantially 8.0 $\mu$m–10.0 $\mu$m) of a first photoresist layer overlying the NiFe seed layer.

With reference additionally now to FIG. 1B, a follow-on cross-sectional view of the structure of FIG. 1A is shown illustrating the application of a relatively thick coating of a first photoresist layer 14 overlying the seed layer 12 (no longer illustrated for purposes of clarity) which serves as a bottom layer in the technique of the present invention. The first photoresist layer 14 may be applied to a thickness of on the order of substantially 6.0 $\mu$m–10.0 $\mu$m. Following the coating of the first photoresist layer 14, it is soft baked at a suitable temperature of on the order of 140°–160° Celsius ("C"). The photoresist utilized for the first photoresist layer 14 will preferably have a relatively high etch rate to reactive ion etching ("RIE") and not decompose during the subsequent intermediate or middle layer deposition as will be more fully described hereinafter.

Figure 1C:
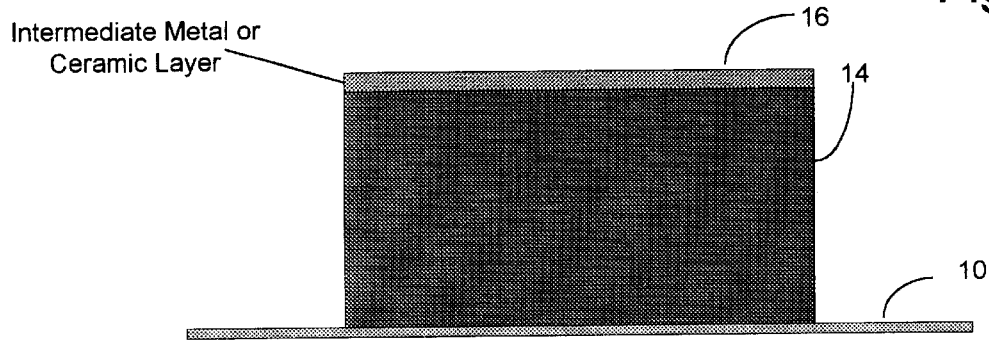
FIG. 1C is a follow-on cross-sectional view of the structure of FIG. 1B illustrating the additional deposition of an intermediate metal or ceramic layer of on the order of substantially 0.5 $\mu$m–2.0 $\mu$m in thickness overlying the first photoresist layer.

With reference additionally now to FIG. 1C, a follow-on cross-sectional view of the structure of FIG. 1B is shown illustrating the additional deposition of an intermediate metal (or ceramic) layer 16 overlying the first photoresist layer 14. In a preferred embodiment, the intermediate layer 16 is deposited to a thickness of on the order of substantially 0.1 $\mu$m–2.0 $\mu$m. The material chosen for the intermediate layer 16, for example $Al_2O_3$ and other metal layers, including those comprising titanium, (Ti) chromium (Cr) and the like, should preferably have a suitable etch rate during a first RIE etching operation as well as good selectivity to photoresist during a subsequent second RIE etching operation as will be more fully described hereinafter.

Figure 1D:
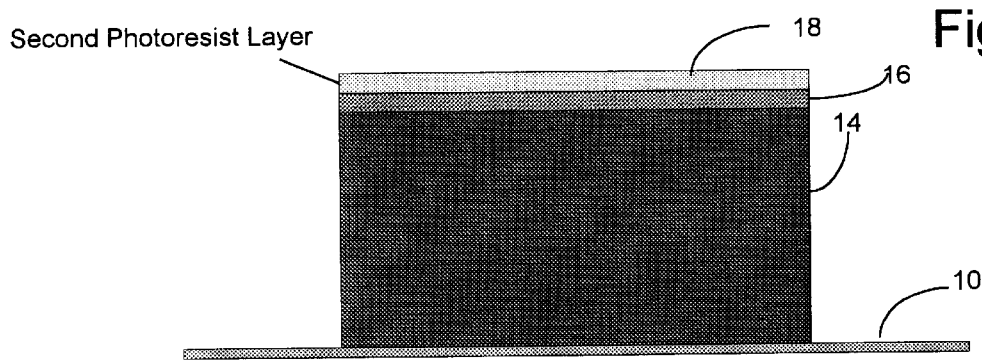
FIG. 1D is a follow-on cross-sectional view of the structure of FIG. 1C illustrating the additional application of a second photoresist layer of on the order of substantially 0.25 $\mu$m–1.0 $\mu$m in thickness overlying the intermediate metal or ceramic layer.

With reference additionally now to FIG. 1D, a follow-on cross-sectional view of the structure of FIG. 1C is shown illustrating the additional application of a second photoresist layer 18 overlying the intermediate layer 16. The second photoresist layer 18 is applied to a thickness of substantially less than that of the first photoresist layer 14 and generally to a thickness of on the order of substantially 0.25 $\mu$m–0.1 $\mu$m. A preferred material for the second photoresist layer 18 will exhibit good selectivity to the intermediate layer 16 during a subsequent first RIE etching operation.

Figure 1E:
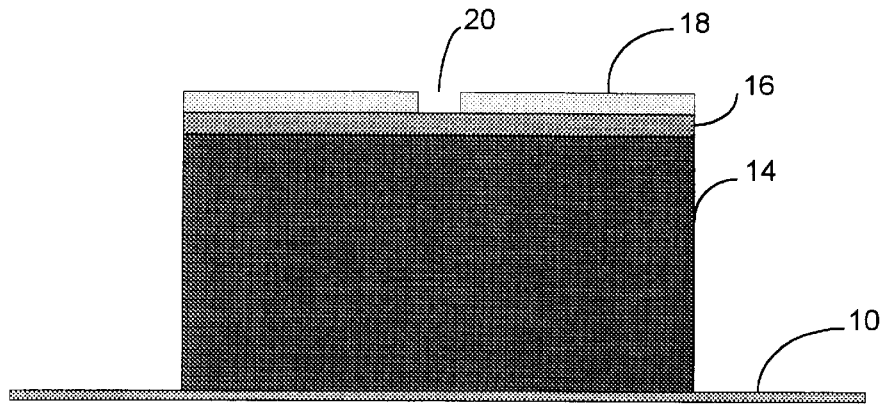
FIG. 1E is a follow-on cross-sectional view of the structure of FIG. 1D illustrating the initial patterning of the second photoresist layer to produce an opening therein.

With reference additionally now to FIG. 1E, a follow-on cross-sectional view of the structure of FIG. 1D is shown illustrating the initial patterning of the second photoresist layer 18 to produce an opening 20 therein. Because the second photoresist layer 18 is relatively very thin, good line width control may be achieved during the patterning operation.

Figure 1F:
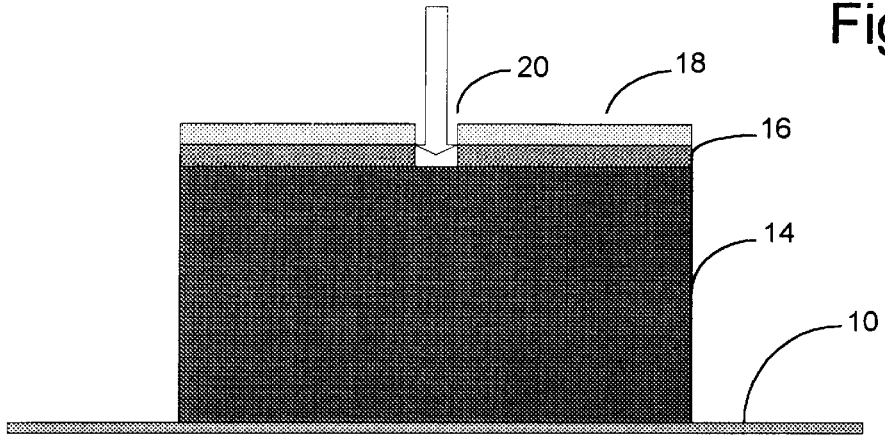
FIG. 1F is a follow-on cross-sectional view of the structure of FIG. 1E illustrating a first reactive ion etching step through the opening formed in the patterned second photoresist layer and the underlying intermediate metal or ceramic layer.

With reference additionally now to FIG. 1F, a follow-on cross-sectional view of the structure of FIG. 1E is shown illustrating a first reactive ion etching step through the opening 20 formed in the patterned second photoresist layer 18. During this first RIE operation, the underlying intermediate layer 16 is etched utilizing the upper, or second photoresist layer 18 as a masking layer. The first RIE operation is conducted until the first photoresist layer 14 is reached as an endpoint to the process.

Figure 1G:
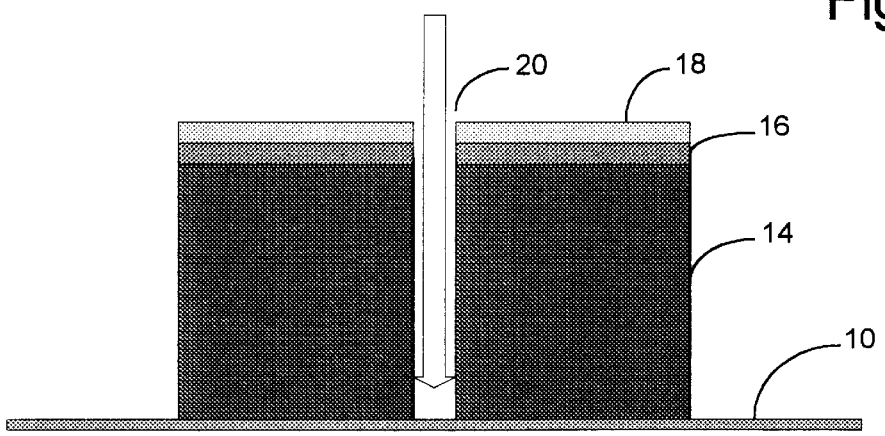
FIG. 1G is a follow-on cross-sectional view of the structure of FIG. 1F illustrating a second reactive ion etching step through the opening formed in the intermediate metal or ceramic layer and the underlying first photoresist layer.

With reference additionally now to FIG. 1G, a follow-on cross-sectional view of the structure of FIG. 1F is shown illustrating a second reactive ion etching step through the opening 20 formed in the intermediate layer 16. In this step, the lower, or first photoresist layer 14 is etched utilizing the intermediate layer 16 as a masking layer. The selectivity of the intermediate layer 16 must be acceptable with respect to that of the underlying first photoresist layer 14 while the latter must also exhibit a relatively high etch rate during this process. The seed layer 12 (not shown), whether NiFe or other suitable material will preferably provide an acceptable etch stop, that is, it must have a relatively low etch rate during the second RIE processing step such that it is not appreciably etched thereby.

Figure 1H:
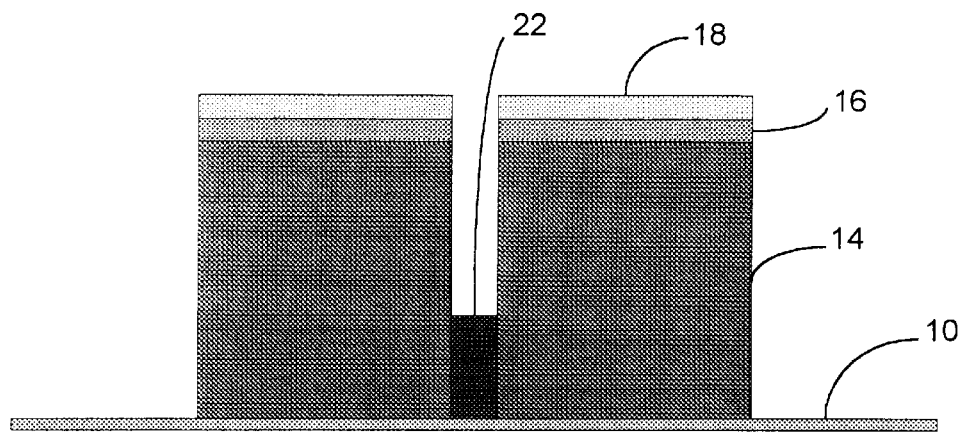
FIG. 1H is a follow-on cross-sectional view of the structure of FIG. 1G illustrating the step of electroplating NiFe material for the top pole in the opening formed in the second photoresist layer, the underlying intermediate metal or ceramic layer and the underlying first photoresist layer.

With reference additionally now to FIG. 1H, a follow-on cross-sectional view of the structure of FIG. 1G is shown illustrating the step of electroplating NiFe (or other suitable material) for the top pole 22 of the write head in the opening 20 formed through the second photoresist layer 18, the underlying intermediate layer 16 and the underlying first photoresist layer 14.

Figure 1I:
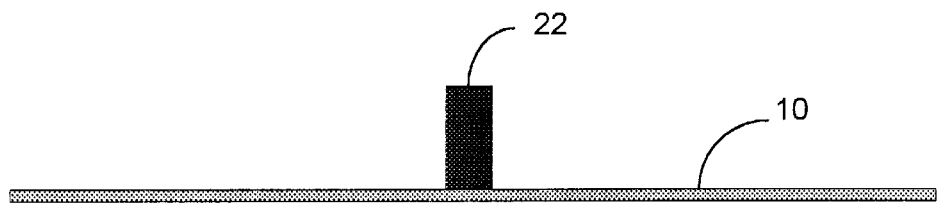
FIG. 1I is a final follow-on cross-sectional view of the structure of FIG. 1H showing the resultant top pole formed following the stripping away of the first and second photoresist layers and the intermediate metal or ceramic layer.

With reference additionally now to FIG. 1I, a final follow-on cross-sectional view of the structure of FIG. 1H is shown illustrating the resultant top pole 22 formed following the stripping away of the first and second photoresist layers 14, 18 and the intermediate layer 16. In a preferred embodiment the height of the top pole is substantially 1.0 $\mu$m–2.5 $\mu$m with a corresponding width of approximately 0.35 $\mu$m–1.2 $\mu$m.

Figure 2:
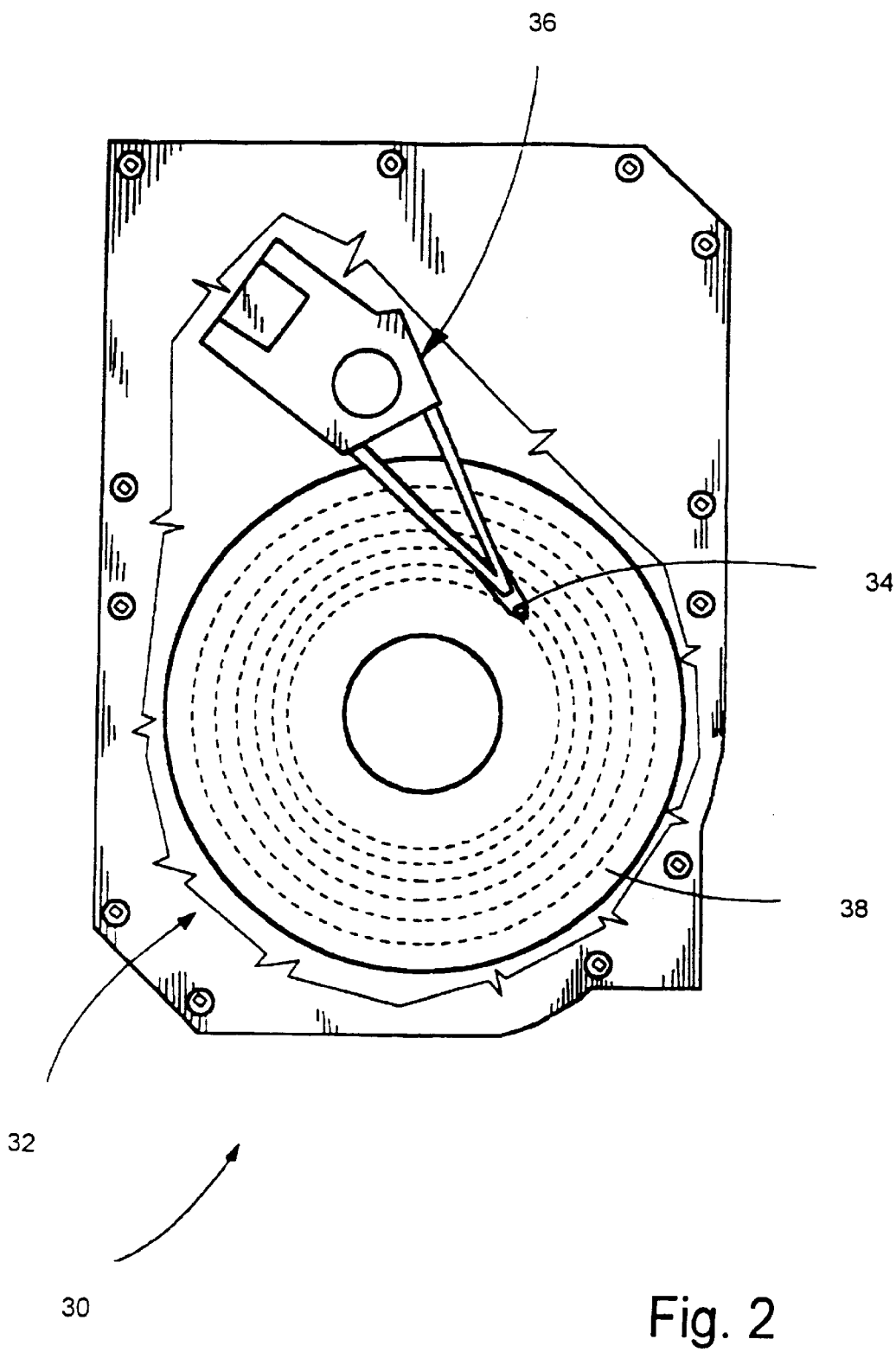
FIG. 2 is a simplified, cut-away, top plan view of a conventional disk drive constituting one possible computer mass storage device application of a read head produced in accordance with the technique of the present invention.

With reference additionally now to FIG. 2, a simplified, cut-away, top plan view of a disk drive 30 is shown for possible use in conjunction with a read/write head produced in accordance with the technique of the present invention. The disk drive 30 comprises, in pertinent part, a number of disks 32 which may be rotated about a central axis. A read/write head 34, which may be produced as above-described, is positioned by means of a positioner 36 with respect to a number of concentric data tracks on the surfaces 38 of the disks 32 to enable data to be written to, or read from, the magnetically hard surfaces 178 thereof. The read/write head 34 hereinbefore disclosed may also be utilized in conjunction with tape drives and other computer mass storage applications as well.

While there have been described above the principles of the present invention in conjunction with specific exemplary materials and process flows, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A process for forming a pole tip in a data transducer write head comprising:

provoding a substrate;

forming a seed layer covering the substrate applying a first photoresist layer overlying said substrate;

applying an intermediate layer overlying said substrate;

applying a second photoresist layer overlying said intermediate layer, said second photoresist layer being relatively thinner than said first photoresist layer;

patterning said second photoresist layer to produce an opening therein etching said intermediate layer utilizing said opening as a mask;

further etching said first photoresist layer with reactive ion etching to expose the seed layer through said opening utilizing said intermediate layer as another mask so as to transfer the opening defined in the second photoresist layer to an opening in the first photoresist layer;

forming said pole tip within said opening etched in said first photoresist layer; and removing said first and second photoresist layers and said intermediate layer to expose said pole tip.

2. The process of claim 1 wherein said step of providing said substrate is carried out by the step of:

furnishing an $Al_2O_3$ gap layer.

3. The process of claim 1 further comprising the step of:

depositing a seed layer on said substrate underlying said first photoresist layer.

4. The process of claim 3 wherein said step of depositing said seed layer is carried out by the deposition of NiFe to a thickness of substantially 1000 Å–2000 Å.

5. The process of claim 1 wherein said step of applying said first photoresist layer is carried out by the step of:

coating said substrate with a photoresist material to a thickness of substantially between 6.0 $\mu$m and 10.0 $\mu$m.

6. The process of claim 5 wherein said step of applying said first photoresist layer further comprises the step of:

baking said photoresist material at a temperature of substantially between 140°–160° C.

7. The process of claim 1 wherein said step of applying said intermediate layer comprises the step of:

depositing a metal or ceramic layer overlying said first photoresist layer.

8. The process of claim 7 wherein said step of depositing is carried out by the deposition of $Al_2O_3$ to a thickness of substantially 0.1 $\mu$m–2.0 $\mu$m.

9. The process of claim 1 wherein said step of applying said second photoresist layer comprises the step of:

coating said intermediate layer with a photoresist material to a thickness of substantially between 0.25 $\mu$m and 1.0 $\mu$m.

10. The process of claim 1 wherein said step of etching said intermediate layer is carried out until said intermediate layer is etched to said first photoresist layer.

11. The process of claim 1 wherein said step of etching said first photoresist layer is carried out until said first photoresist layer is etched substantially to said substrate.

12. The process of claim 1 wherein said step of forming said pole tip is carried out by the step of:

plating NiFe within said opening in said first photoresist layer to a height of substantially between 1.0 $\mu$m–4.5 $\mu$m.

13. The process of claim 1 wherein said step of removing is carried out by the step of:

stripping said first and second photoresist layers and said intermediate layer surrounding said pole tip.

14. A method for forming a read/write head comprising:

providing a substrate having an upper surface;

forming a seed layer on the upper surface;

forming a thick photoresist layer covering the seed layer;

forming a intermediate layer on the thick photoresist layer;

forming a thin photoresist layer on the intermediate layer;

patterning the thin photoresist layer;

transferring the pattern from the thin photoresist layer to the intermediate layer;

transferring the pattern from the intermediate layer to the thick photoresist layer with reactive ion etching to create an opening in the thick photoresist layer exposing a portion of the seed layer, the opening having a size determined by the pattern in the thin photoresist layer;

forming a pole tip by electroplating through the opening onto the exposed portion of the seed layer; and removing the thick photoresist, thin photoresist, and intermediate layers.

15. A method for forming a thin film structure comprising:

providing a substrate;

applying a first layer of etchable material on the substrate, the first layer having a thickness chosen to be greater than the height of the thin film structure;

covering the first layer with a second layer of material that is selective etchable with respect to the first layer;

covering the second layer with a patternable layer having a thickness substantially less than the first layer and comprising a material that is selectively etchable with respect to the second layer;

forming an opening having a defined size in the patternable layer;

etching the second layer to extend the opening through the second layer;

etching the first layer with reactive ion etching to extend the opening through the first layer and exposes a portion of the substrate using the second layer as a mask such that size of the exposed portion is determined by the size of the opening formed in the patternable layer.

16. The method of claim 15 further comprising:

after the portion of the substrate is exposed, filling the opening with a conductive material to a height less than the thickness of the first layer; and removing the first, second, and third layers.

* * * * *

UNITED STATES PATENT AND TRADEMARK OFFICE
CERTIFICATE OF CORRECTION

PATENT NO. : 6,156,487
DATED : December 5, 2000
INVENTOR(S) : Michael J. Jennison and Wei Pan It is certified that error appears in the above-identified patent and that said Letters Patent is hereby corrected as shown below:

Claim 15,
Line 5, "selective" should read -- selectively --

Signed and Sealed this

Twenty fifth Day of September, 2001

Attest:

*Nicholas P. Godici*

NICHOLAS P. GODICI
*Attesting Officer*   *Acting Director of the United States Patent and Trademark Office*